(12) United States Patent
Chan et al.

(10) Patent No.: US 12,527,079 B2
(45) Date of Patent: Jan. 13, 2026

(54) METHOD FOR FORMING A STACKED FET DEVICE

(71) Applicant: IMEC VZW, Leuven (BE)

(72) Inventors: Boon Teik Chan, Wilsele (BE); Dunja Radisic, Heverlee (BE); Anne Vandooren, Mazy (BE); Juergen Boemmels, Heverlee (BE)

(73) Assignee: Imec vzw, Leuven (BE)

( * ) Notice: Subject to any disclaimer, the term of this patent is extended or adjusted under 35 U.S.C. 154(b) by 533 days.

(21) Appl. No.: 18/064,508

(22) Filed: Dec. 12, 2022

(65) Prior Publication Data
US 2023/0197726 A1   Jun. 22, 2023

(30) Foreign Application Priority Data

Dec. 17, 2021   (EP) .................................... 21215363

(51) Int. Cl.
*H10D 84/85*      (2025.01)
*H10D 30/67*      (2025.01)
(Continued)

(52) U.S. Cl.
CPC ....... *H10D 84/856* (2025.01); *H10D 30/6757* (2025.01); *H10D 64/017* (2025.01); *H10D 84/0135* (2025.01); *H10D 84/0149* (2025.01); *H10D 84/0172* (2025.01); *H10D 84/0181* (2025.01); *H10D 84/0186* (2025.01); *H10D 84/038* (2025.01); *B82Y 10/00* (2013.01); *H10D 30/014* (2025.01); *H10D 30/43* (2025.01); *H10D 30/6735* (2025.01); *H10D 62/121* (2025.01);
(Continued)

(58) Field of Classification Search
None
See application file for complete search history.

(56) References Cited

U.S. PATENT DOCUMENTS

2017/0287905 A1   10/2017  Morrow et al.
2020/0006330 A1*   1/2020  Lilak .................... H10D 84/853
(Continued)

OTHER PUBLICATIONS

Extended European Search Report and Written Opinion, Application No. EP 21215363.9, mailed Jun. 1, 2022, 11 pages.

*Primary Examiner* — Christine S. Kim
*Assistant Examiner* — Andrew Victor Prostor
(74) *Attorney, Agent, or Firm* — McDonnell Boehnen Hulbert & Berghoff LLP

(57) ABSTRACT

Example embodiments relate to methods for forming a stacked FET device. An example method includes forming a bottom FET device that includes a source, a drain, at least one channel layer between the source and drain, and a bottom gate electrode arranged along the at least one channel layer. The method also includes forming a bonding layer over the bottom FET. Additionally, the method includes forming a top FET device on the bonding layer. Forming the top FET device includes forming a device layer structure. The device layer structure includes at least one channel layer of a channel semiconductor material and a top sacrificial layer of a sacrificial semiconductor material. Further, the method includes replacing the top sacrificial layer with a dummy layer of a dielectric dummy material, forming a gate-to-gate contact trench, depositing gate electrode material, and forming a source and a drain of the top FET device.

12 Claims, 14 Drawing Sheets

(51) Int. Cl.
*H10D 64/01* (2025.01)
*H10D 84/01* (2025.01)
*H10D 84/03* (2025.01)
*B82Y 10/00* (2011.01)
*H10D 30/01* (2025.01)
*H10D 30/43* (2025.01)
*H10D 62/10* (2025.01)
*H10D 62/13* (2025.01)

(52) U.S. Cl.
CPC ....... *H10D 62/151* (2025.01); *H10D 84/0177* (2025.01)

(56) References Cited

U.S. PATENT DOCUMENTS

| | | | |
|---|---|---|---|
| 2021/0233910 A1 | 7/2021 | Yeh et al. | |
| 2021/0265348 A1* | 8/2021 | Xie | H10D 88/01 |
| 2021/0349691 A1 | 11/2021 | Hekmatshoartabari et al. | |
| 2023/0178553 A1* | 6/2023 | Xie | H10D 62/121 |
| | | | 257/351 |
| 2023/0402519 A1* | 12/2023 | Anderson | H10D 84/0128 |
| 2023/0411358 A1* | 12/2023 | Xie | H10D 88/00 |
| 2024/0064951 A1* | 2/2024 | Chu | H10D 84/83 |

\* cited by examiner

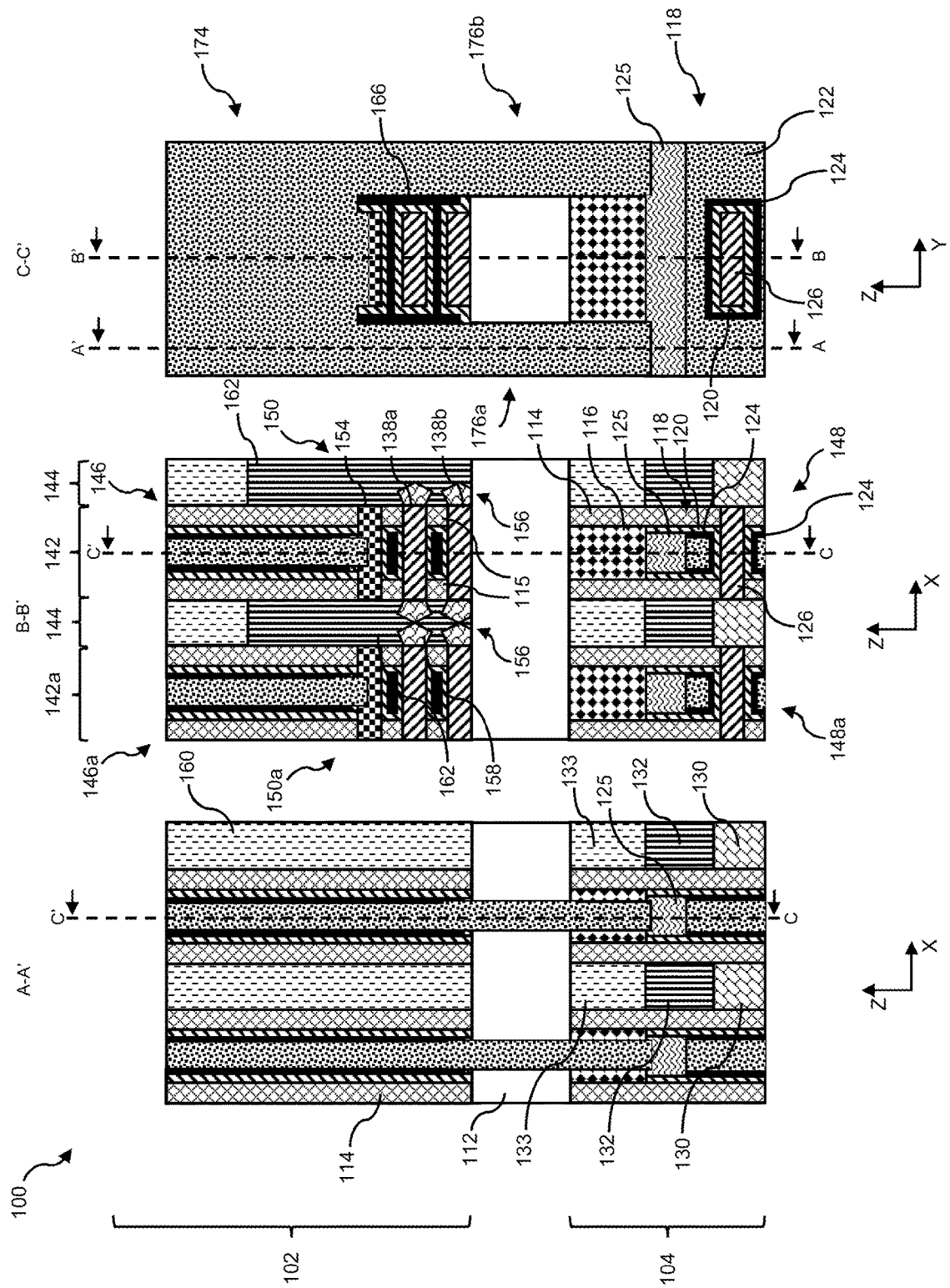

METHOD FOR FORMING A STACKED FET DEVICE

CROSS-REFERENCE TO RELATED APPLICATIONS

The present application is a non-provisional patent application claiming priority to European Patent Application No. EP 21215363.9, filed Dec. 17, 2021, the contents of which are hereby incorporated by reference.

FIELD OF THE DISCLOSURE

The present disclosure relates to a method for forming a stacked field-effect transistor (FET) device, e.g. a complementary field-effect transistor (CFET) device.

BACKGROUND

A Complementary Field-Effect Transistor (CFET) is a transistor device having a complementary pair of FETs, stacked on top of each other (e.g. an nFET device stacked on top of a pFET device or vice versa). The CFET allows a reduced footprint compared to a traditional side-by-side arrangement of a pFET and nFET. The two device levels provided by the CFET (e.g. a "2-level middle-of line/MOL") further enables a reduced routing layer usage (e.g. in the back-end-of line/BEOL). The CFET hence facilitates realization of area efficient circuitry.

A CFET device may be formed using a monolithic approach or a sequential approach. A "monolithic" CFET may include a gate electrode which is physically and electrically common (i.e. a monolithic gate electrode) to the top and bottom device. Meanwhile, a "sequential CFET" allows separate gate electrodes for the top and bottom devices.

In certain types of circuit cells, having an electrically connected gate may be useful. In the case of a sequential CFET this can be achieved by a short vertical top-to-bottom-gate-via connecting the gates of the top and bottom FET. However, forming such a connection can entail complications. Thus, there is a need for improved ways of forming a sequential CFET having electrically connected top and bottom gate electrodes.

SUMMARY

The present disclosure provides an improved method for forming a stacked field-effect transistor device, e.g. a sequential CFET, with a common gate.

According to an aspect of the present disclosure, there is provided a method for forming a stacked field-effect transistor (FET) device. The method comprises:

forming a bottom FET device comprising a source, a drain, at least one channel layer between the source and drain, and a bottom gate electrode arranged along the at least one channel layer;

forming a bonding layer over the bottom FET device; and forming a top FET device on the bonding layer, wherein forming the top FET device comprises:

forming a device layer structure comprising at least one channel layer of a channel semiconductor material, and over the at least one channel layer a top sacrificial layer of a sacrificial semiconductor material;

replacing the top sacrificial layer with a dummy layer of a dielectric dummy material;

subsequent to replacing the top sacrificial layer, forming a gate-to-gate contact trench beside the device layer structure, the gate-to-gate contact trench exposing a top surface of the bottom gate electrode, wherein forming the gate-to-gate contact trench comprises etching the bonding layer;

depositing gate electrode material to form a top gate electrode along the at least one channel layer and a gate-to-gate contact in the gate-to-gate contact trench; and forming a source and a drain of the top FET device;

wherein forming the top FET device further comprises:

subsequent to replacing the top sacrificial layer and prior to etching the bonding layer, conformally depositing a gate dielectric, wherein forming the top FET device further comprises etching back the gate dielectric in a top-down direction and then etching the bonding layer; or subsequent to replacing the top sacrificial layer and etching the bonding layer, conformally depositing a gate dielectric, wherein forming the top FET device further comprises etching back the gate dielectric in a top-down direction prior to depositing the gate electrode material.

Example embodiments for forming a stacked FET device enable an improved way of forming the gate-to-gate contact. In particular, it may reduce a risk of damage to a topmost channel layer of the top FET device. This because the dummy layer may serve as an etch mask, counteracting etching of the one or more channel layers of the top FET device, arranged below the dummy layer, e.g. during the etching of the bonding layer and the etching of the gate dielectric. The dummy layer may especially counteract etching of a top-most channel layer of the one or more channel layers, and of portions of the gate dielectric thereon.

A conformal deposition of the gate dielectric facilitates deposition of a high quality film, with uniform thickness and reliable coverage of surfaces in any orientation, e.g. including vertically oriented side surfaces of the device layer structure as well as any horizontally oriented surfaces of the device layer structure being physically exposed but hidden as viewed along a top-down direction. Therefore, owing to this characteristic of a conformal deposition, the method comprises a step of etching back the gate dielectric in a top-down direction (e.g. anisotropically in a top-down direction) to facilitate an electrical contact between the top and bottom gate electrodes. That is, by etching back the gate dielectric in a top-down direction, portions of the gate dielectric deposited on horizontally oriented surfaces on top of and beside the device layer structure may be removed. Such portions of the gate dielectric may in the following be denoted "horizontally oriented layer portions of the gate dielectric". The gate dielectric (which is to be understood as a material different from the dielectric dummy material) may in particular be etched selectively to the dummy material of the dummy layer, i.e. at a greater rate than the dummy material.

The gate dielectric may, according to the method, be deposited prior to etching the bonding layer. In this case, the gate dielectric may be deposited over the device layer structure and the bonding layer, wherein forming the gate-to-gate contact trench may comprise etching back the gate dielectric (in the top-down direction) and then etching the bonding layer. Portions of the gate dielectric on the bonding layer beside the device layer structure, may thereby be removed to expose an upper surface of the bonding layer, which then may be etched. The etching of the gate dielectric may further result in etching of portions of the gate dielectric on the dummy layer. Since the dummy layer will not form an electrically active part of the top FET device, presence of gate dielectric on the dummy layer is not a requirement for a proper device operation. Additionally, the dummy layer and portions of the gate dielectric thereon may mask the at least one channel layer and portions of the gate dielectric thereon during the (top-down) etching of the gate dielectric and the etching of the bonding layer.

Alternatively, the gate dielectric may according to the method be deposited subsequent to etching the bonding layer. In this case, the gate dielectric may be deposited over the device layer structure, and in a trench etched in the bonding layer, wherein the method may comprise etching back the gate dielectric (in the top-down direction) to remove a portion of the gate dielectric from a bottom surface of the trench etched in the bonding layer, and subsequently depositing the gate electrode material. The trench etched in the bonding layer may be the (final) gate-to-gate contact trench, wherein the portion of the gate dielectric may be removed from the upper surface of the bottom gate electrode. The trench may alternatively (as set out in embodiments below) be a preliminary trench etched in the bonding layer to expose an upper surface of a capping layer, wherein the portion of the gate dielectric may be removed from the upper surface of the capping layer.

The method may be used during a masked approach of forming the gate-to-gate contact trench, i.e. when using an etch mask to define a location of the gate-to-gate contact trench, wherein misalignment of the mask otherwise may result in the device layer structure being exposed to the etch. However, it may also be used in an un-masked approach, where the dummy layer can serve as the etch mask such that the gate-to-gate contact trench may be etched self-aligned to the device layer structure of the top FET device. In other words, in either approach better precision in forming the gate-to-gate contact trench can be achieved.

Since the dummy layer is formed of a dielectric dummy material, the influence of the dummy layer on the electrical performance of the top FET device may be minimized.

The process of first forming the sacrificial layer of the sacrificial semiconductor material as a layer on top of the at least one channel layer, and then in a later step replacing the sacrificial layer with the dummy layer of the dielectric dummy material with different properties from the sacrificial semiconductor material may allow the method to be combined with process steps typically forming part of conventional sequential CFET fabrication without introducing further complexity with respect to such process steps, e.g. fin patterning, gate spacer etch of a replacement metal gate process, and fin recess may proceed in a conventional manner.

By the wording "stacked field-effect transistor device" is hereby meant a device comprising a bottom FET device and a top FET device stacked on top of the bottom FET device. More specifically, the top FET device may be arranged directly above the bottom FET device. "Directly above" is hereby to be understood as a relative arrangement of the bottom and top FET device such that the respective source and drain of the bottom FET device and the top FET device, and the bottom and top gate electrode intersect a common geometrical vertical plane. The stacked FET device may be a so-called complementary FET device. That is, the bottom FET device may be of a first conductivity type (e.g. n-type) and the top FET device may be of a second opposite conductivity type (e.g. p-type) stacked on top of the bottom FET device.

By the wording "bonding layer" is hereby meant a layer or composite layer structure arranged between the top and bottom FET device for bonding the top and bottom FET device together. The bonding layer may comprise one or more layers of insulating material, e.g. different insulating materials. The gate-to-gate contact may thus form a gate-to-gate connection bridging the (insulating) bonding layer.

The wording at least one channel layer "between" the source and drain refers to the at least one channel layer extending between and connecting the source and the drain. The at least one channel layer may more specifically be a horizontally oriented channel layer, e.g. extending between the source and the drain in a horizontal direction.

Relative spatial terms such as "top", "bottom", "lower", "vertical", "stacked on top of", "beside", "over", "lateral", and "horizontal" are used to refer to locations or directions within a frame of reference of the stacked FET device. In particular, "top", "bottom", "lower", "vertical", and "stacked on top of" may be understood in relation to a bottom-up direction of the stacked FET device (i.e. a direction from the bottom FET device towards the top FET device), or equivalently a normal direction to a substrate on which the stacked FET device is formed, in particular a main plane of extension of the substrate. Correspondingly, the terms "horizontal" and "lateral" may be understood as locations or orientations transverse to the bottom-up direction, i.e. in relation to/along (the main plane of extension of) the substrate.

By the wording "over" as in "over the at least one channel layer a top sacrificial layer" is hereby meant that the top sacrificial layer covers or overlaps the at least one channel layer, as viewed along a top-down direction. More specifically, the top sacrificial layer may overlap an entire top surface of the at least one channel layer.

By the wording "conformal deposition" is hereby meant a deposition process resulting in a conformally growing layer or film. Conformal deposition may be achieved using an atomic layer deposition (ALD) process.

Replacing the top sacrificial layer with the dummy layer may comprise:
  removing the top sacrificial layer selectively to the at least one channel layer, and
  depositing a dielectric dummy material in a space formed by the removing of the top sacrificial layer.

As used herein, the wording "selective" in connection with "removal" or "etching" of a layer or a material is to be understood as a removal of the layer or the material by a selective etching process, wherein a removal rate/etch rate of the layer or the material to be selectively removed/etched exceeds a removal rate/etch rate of at least one other layer or material exposed to the etching process. Accordingly, the top sacrificial layer may be removed by selectively etching the sacrificial semiconductor material.

The dielectric dummy material may be conformally deposited to fill the space formed by removing the top sacrificial layer. The method may further comprise removing dielectric dummy material deposited outside the space by isotropically etching the dielectric dummy material.

By conformally depositing the dielectric dummy material, the dielectric dummy material may reliable fill the space formed by removing the top sacrificial layer, even though the space may be covered from above. The deposition of the dielectric dummy material may be continued until the space is pinched-off/closed by the dielectric dummy material. The subsequent isotropic etching allows portions of the dielectric dummy material deposited outside the space to be removed such that a discrete dummy layer remains over the at least one channel layer of the device layer structure.

Forming the top FET device may further comprise:
subsequent to replacing the top sacrificial layer, exposing the device layer structure in a gate trench by removing a dummy gate extending across the device layer structure;
wherein the gate dielectric subsequently may be conformally deposited in the gate trench, and
wherein the above-mentioned etching of the bonding layer and the gate dielectric may be conducted in the gate trench.

The method may for example comprise, prior to etching the bonding layer, conformally depositing the gate dielectric in the gate trench, wherein forming the gate-to-gate contact trench may comprise etching back (i.e. top-down) the gate dielectric deposited on a bottom surface of the gate trench beside the device layer structure.

The replacement of the top sacrificial layer by the dummy layer may hence be performed within a gate trench, e.g. during a replacement metal gate process.

The method may comprise forming the dummy gate across the device layer structure prior to the replacement of the top sacrificial layer. The dummy gate may be surrounded by an insulating layer wherein the gate trench may extend through the insulating layer.

Forming the gate-to-gate contact trench may comprise etching, in the gate trench, the gate dielectric and then the bonding layer on each side of the device layer structure.

Forming the device layer structure may comprise:
forming a fin structure on the bonding layer by patterning an initial device layer structure comprising the at least one channel layer and the top sacrificial layer,
forming a dummy gate extending across the fin structure, and
recessing the fin structure at either side of the dummy gate to form the device layer structure;
and wherein replacing the top sacrificial layer may comprise removing the top sacrificial layer selectively to the at least one channel layer by etching the top sacrificial layer from opposite end surfaces of the device layer stack, the end surfaces being defined by the recessing of the fin structure.

A space may hence be defined between (a top-most one of) the at least one channel layer and the dummy gate, which subsequently may be filled with the dielectric dummy material (e.g. by conformal deposition).

The dummy material may be formed of a dielectric material different from a material of the bonding layer.

This allows for the dummy material to act as an etch mask during the forming of the gate-to-gate contact trench. In other words, bonding layer may be etched selectively to the dielectric material of the dummy material The dummy material may further be formed of a dielectric material different from a material of the gate dielectric.

The bottom FET device may comprise a capping layer on top of the bottom gate electrode, wherein the capping layer may be formed of a dielectric material different from the dummy material, and wherein forming the gate-to-gate contact trench may further comprise etching the capping layer.

Accordingly, forming the gate-to-gate contact trench may comprise forming a preliminary (gate-to-gate contact) trench in the bonding layer by etching the bonding layer and subsequently forming the (final) gate-to-gate contact trench by further etching the capping layer via the preliminary trench in the bonding layer.

Having the dummy material different from the capping layer of the bottom FET device may allow the dummy layer to mask the at least one underlying channel layer of the top FET device also during the etching of the capping layer.

Forming the top FET device may further comprise, subsequent to depositing the gate dielectric, conformally depositing a work function metal on the gate dielectric, wherein forming the top FET device may further comprise etching the work function metal in a top-down direction and then the gate dielectric. Presence of work function metal between the bottom gate electrode and the gate-to-gate contact may hence be avoided, which otherwise could tend to result in an increased gate-to-gate contact resistance. As may be appreciated from the above discussion, the work function metal may, like the gate dielectric layer, be deposited either prior to etching the bonding layer or thereafter. Accordingly, the above detailed discussion concerning the top-down etching of the gate dielectric layer may apply correspondingly to the top-down etching of the work function metal.

The device layer structure may comprise a lower sacrificial layer arranged on the at least one channel layer, wherein the top sacrificial layer may be arranged on the lower sacrificial layer, wherein the top sacrificial layer may be formed of a first sacrificial semiconductor material and the lower sacrificial layer may be formed of a second sacrificial semiconductor material different from the first sacrificial semiconductor material and the channel semiconductor material, and wherein forming the top FET device may further comprise:
subsequent to replacing the top sacrificial layer and prior to depositing the gate dielectric, removing the lower sacrificial layer selectively to the at least one channel layer.

Removing the lower sacrificial layer between the channel layer (i.e. a top-most channel layer in case of more than one channel layer) and the top sacrificial layer prior to depositing the gate dielectric allows the gate dielectric to be deposited on the top surface of the (top-most) of channel layer. This applies correspondingly to the gate electrode material, and a gate work function metal which may be deposited on the gate dielectric as set out above. Thereby the top gate electrode may be formed along the top-surface of the (top-most) channel layer. In any case, the dummy layer may accordingly mask the gate dielectric (and gate work function metal) along the top-surface of the top-most channel layer during the forming of the gate-to-gate contact trench, and the top-down etch of the gate dielectric layer.

The device layer structure may comprise a further lower sacrificial layer of the second sacrificial semiconductor material, wherein the channel layer may be arranged on the further lower sacrificial layer. The method may accordingly comprise, subsequent to replacing the top sacrificial layer and prior to depositing the gate dielectric, removing each of the lower and the further lower sacrificial layer selectively to the channel layer.

The channel layer may thus be "released" in the sense that both a top side and a bottom side may be exposed prior to the deposition of the gate dielectric. Thereby a gate-all-around may be formed.

The lower sacrificial layer, and the further lower sacrificial layer if present, may be removed prior to forming the gate-to-gate contact trench or after forming the gate-to-gate contact trench.

The method may further comprise depositing a dielectric layer over the source and drain and a mask layer over the dielectric layer, wherein the mask layer may act as an etch mask while etching the bonding layer.

The source/drain and the dielectric layer may hence be masked from above by the mask layer.

In embodiments comprising removing a dummy gate, the mask layer may further act as an etch mask while removing the dummy gate.

BRIEF DESCRIPTION OF THE DRAWINGS

The above, as well as additional features may be better understood through the following illustrative and non-limiting detailed description, with reference to the appended drawings. In the drawings like reference numerals will be used for like elements unless stated otherwise.

FIG. 1N illustrates a stage of forming a stacked field-effect transistor device in three schematically depicted cross-sectional views, according to example embodiments.

DETAILED DESCRIPTION

Example embodiments will now be described more fully hereinafter with reference to the accompanying drawings. The present disclosure may, however, be implemented in many different forms and should not be construed as limited to the variants set forth herein; rather, these variants are provided for thoroughness and completeness, and fully convey the scope of the present disclosure to the skilled person.

An embodiment of a method for forming a stacked field-effect transistor (FET) device will now be described with reference to FIGS. 1A-1N. It is to be noted that the relative sizes of the different layers may not be representative to a physical realization of a stacked FET device. For example, some structures and layers may have been exaggerated herein for illustrative purposes.

Figure 1A:
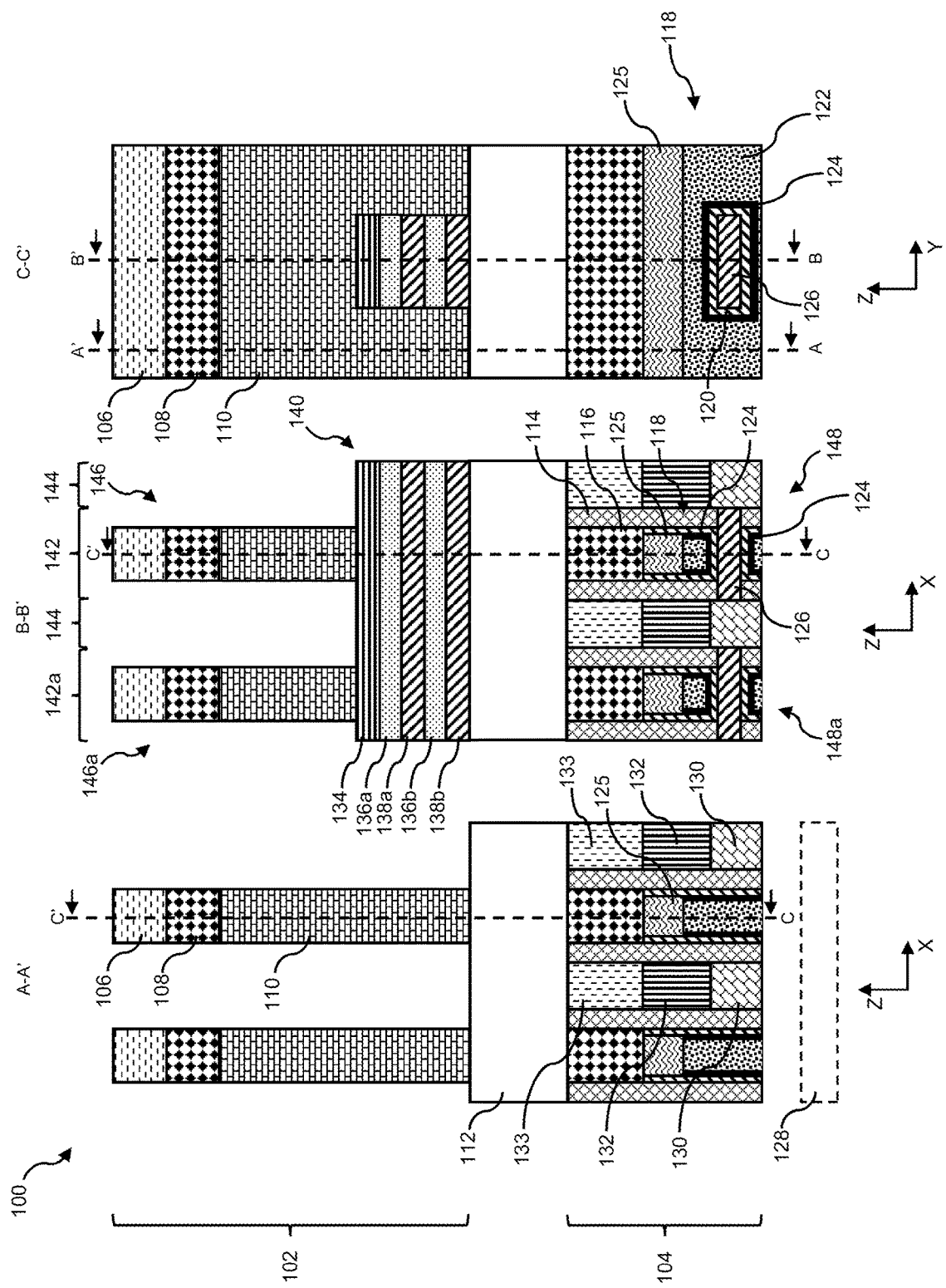
FIG. 1A illustrates a stage of forming a stacked field-effect transistor device in three schematically depicted cross-sectional views, according to example embodiments.

FIGS. 1A-1N illustrate example views of the stacked FET device formed by the method according to the present disclosure. The stacked FET device is herein shown in different stages of the formation process. Each figure includes three different views of the FET device.

In FIGS. 1A-1N, the X-axis and the Y-axis indicate a first and a second horizontal direction, respectively. The X-axis and Y-axis are parallel to a main plane extension of a substrate 128 (shown in the first cross-sectional view of FIG. 1A) on which the top and bottom FET device 146, 148 are formed. The X-axis is parallel to a channel direction of the top and bottom FET devices. The Y-axis is transverse to the X-axis. The Z-axis indicates a vertical or bottom-up direction (normal to the substrate 128). Terms such as "top" and "bottom" as used herein thus relate to the Z-axis. In each one of FIGS. 1A-1N, the first view (left) is a cross section along the plane A-A' indicated in the third (right) view. The second (center) view is a cross section along the plane B-B' indicated in the third view. The third view is a cross section along the plane C-C' indicated in the first and second view. In FIGS. 1A-1N, different layers (e.g. of different materials) are represented by different pattern fills. Conversely layers of a same material are represented by a same pattern fill.

FIG. 1A shows a preliminary or intermediate device structure 100 of the stacked FET device to be formed, which after further processing may be processed into a final functional stacked FET device. The final functional FET device may be a complementary FET device, i.e. the FET device may include a top FET device of a first conductive type and a bottom FET device of a second opposite conductive type, e.g. the top FET device is a p-type FET device and bottom FET device is an n-type FET device, or vice versa. The preliminary device structure 100 is shown in further processed stages in FIGS. 1B-1N.

With reference to FIG. 1A, the preliminary device structure 100 includes a bottom FET device level 104 that includes a bottom FET device 148, and a top FET device level 102 in which a top FET device is to be formed. The top FET device level 102 is arranged on top of the bottom FET device level 104. A bonding layer is provided between the top FET device level 102 and the bottom FET device level 104. The bonding layer 112 may act as an electrically insulating layer between the top FET device level 102 and the bottom FET device level 104. The bonding layer 112 may be formed by one or more layers of an insulating material e.g. oxides, such as silicon oxide ($SiO_2$) or nitrides such as silicon nitride (SiN) or SiCN.

In the bottom FET device level 104, a bottom FET 148 (partially shown) has been formed. As shown herein, the bottom FET device level 104 may include a number of FETs in series, e.g. a bottom FET device 148 and an additional bottom FET device 148a. Correspondingly, the top FET device level 102 may include a number of FETs, thus the top FET device level 102 illustrated herein includes a preliminary top device structure 146 and an additional preliminary top device structure 146a to be formed into a top FET device and an additional top FET device respectively. The following the method will be described with reference to the bottom FET device 148 and the preliminary top device structure 146 to be formed into a top FET device. However, the additional bottom FET device 148a and additional preliminary top device structure 146a as well as any further bottom FET devices and top device structures may be processed correspondingly.

The bottom FET device 148 may be any conventional FET suitable as a bottom FET device in a stacked FET device, in particular a complementary FET. The bottom FET device 148 illustrated herein shows one bottom channel layer 126. The bottom channel layer 126 may however be part of a bottom device layer structure including two or more channel layers (not shown). The bottom FET device 148 further includes a source/drain 130 on respective ends of the at least one channel layer(s) 126. Along the bottom channel layer 126, a bottom gate electrode 118 is arranged. The bottom gate electrode 118 may extend across the bottom channel layer 126. A top surface of the bottom gate electrode 118 may be in contact with (i.e. abut) the bonding layer 112. Alternatively, a capping layer 116 of a dielectric material may be provided between the bottom gate electrode 118 and the bonding layer 112 as illustrated herein. The capping layer 116 may for example be formed by a dielectric hard mask material, such as SiN.

The bottom FET device 148 further includes a source/drain electrode 132 on each source/drain 130 for forming source and drain contacts. The source/drain electrodes 132 may be of any conventional metal typically used such as source/drain electrode material. Example metals include W, Al, Ru, Mo or Co. The source/drain electrodes 132 may as shown be covered with a dielectric layer 133, for example of an oxide such as $SiO_2$ or another conventional (low-k) inter-layer dielectric material.

The bottom FET device 148 further includes a gate dielectric layer 120 (e.g. of a high-k dielectric, such as $HfO_2$, LaO, AlO, and ZrO) deposited on the bottom channel layer 126. The bottom gate electrode 118 may include gate electrode material that includes one or more metals, such as work function metal and fill metal. According to the illustrated example, the bottom gate electrode 118 includes a work function metal layer 124. The work function metal layer 124 may be provided on the gate dielectric layer 120, i.e. on a side which is not in contact with the bottom channel layer 126, The bottom gate electrode 118 may as shown optionally include one or more additional work function metal layers, commonly referenced 122, provided on the (first) work function metal layer 124. The bottom gate electrode 118 as shown further includes one or more gate fill metals, commonly referenced 125. Examples of gate metals include conventional work function metals, such as TiN, TaN, TiAl, TiAlC, or WCN, or combinations thereof, and gate fill materials such as W and Al. The bottom gate electrode 118 may as shown form a gate-all-around. In other words, the bottom gate may be provided around the bottom channel layer 126, i.e. on all sides of the bottom channel layer 126.

As mentioned above, the bottom FET device 148 may be formed on a substrate 128. Because the bottom FET device 148 may include additional layers not shown herein, the substrate 128 is merely schematically illustrated at a distance from a bottom of the bottom FET device 148. The substrate 128 is omitted from subsequent figures for illustrational clarity.

The substrate 128 may be a conventional semiconductor substrate suitable for complementary FETs. The substrate 128 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

In the top FET device level 102 of FIG. 1A, a preliminary top device structure 146 for forming a top FET device is formed. Reference signs 144 denote respective source/drain regions, i.e. regions in which the source and drains of the top FET device will be formed. Reference sign 142 denote the gate region, i.e. the region in which a gate of the top FET device will be formed. Reference sign 142a denote a gate region of the additional top FET device to be formed. The top FET device to be formed and the additional top FET device to be formed may have one common source drain region 144, as shown. The top device structure 146 is formed on the bonding layer 112 and stacked on top of the bottom FET device 148.

The top device structure 146 in this stage includes a fin structure 140 on the bonding layer 112. A longitudinal dimension of the fin structure 140 is oriented along the direction of the X-axis. The fin structure 140 includes a first and a second channel layer 138a, 138b. In general, the fin structure 140 may include one or more channel layers. The first and second channel layers 138a, 138b may be made of a same channel semiconductor material (hereinafter denoted "channel material"). The first and second channel layers 138a, 138b may in the following be referred to as "the channel layers 138a, 138b".

The fin structure 140 further includes a top sacrificial layer 134 of a first sacrificial semiconductor material (hereinafter denoted "first sacrificial material"). The top sacrificial layer 134 is arranged over the channel layers 138a, 138b. The top sacrificial layer 134 may as shown form a topmost semiconductor layer of the fin structure 140. The first sacrificial material may be different from the channel material of the first and second channel layers 138a, The fin structure 140 further includes a first and second lower sacrificial layer 136a, 136b, and may in the following be referred to as "the lower sacrificial layers 136a, 136b". The first lower sacrificial layer 136a is arranged between the top sacrificial layer 134 and a topmost channel layer of the first and second channel layers 138a, 138b, i.e. the first channel layer 138a as illustrated herein. The second lower sacrificial layer 136b is arranged between the first and second channel layer 138a, 138b. The lower sacrificial layers 136a, 136b may be formed of a second sacrificial semiconductor material, different from the first sacrificial material and the channel material.

The number of channel layers and lower sacrificial layers shown in FIG. 1A are merely an example. The fin structure 140 may include a smaller or greater number of channel layers and lower sacrificial layers.

The fin structure 140 may be formed by patterning an initial device layer structure that includes the channel layer(s), the lower sacrificial layer(s), and the top sacrificial layer, as set out above. The layers of the initial device layer structure may be formed as epitaxial layers, e.g. epitaxially grown using straightforward deposition techniques, such as chemical vapor deposition (CVD) or physical vapor deposition (PVD). The initial device layer structure may for example be formed on a donor wafer, transferred to the bonding layer 112, and subsequently be patterned to define the fin structure. The bonding may include pre-bonding sub-steps, such as plasma treatment, rinsing, and alignment, as well as post-bonding steps such as activation anneal. The initial device layer structure may be patterned using conventional fin patterning techniques, e.g. single patterning techniques such as lithography and etching ("litho-etch") or multiple-patterning techniques such as (litho-etch)$^x$, self-aligned double or quadruple patterning (SADP or SAQP).

The channel layers 138a, 138b, the top sacrificial layer 134, and the lower sacrificial layers 136a, 136b may each be Si-comprising layers, wherein the different layers have different Ge-contents. For example, the channel layers 138a, 138b may be Si-layers, while the top sacrificial layer 134 and the lower sacrificial layers 136a, 136b may be SiGe-layers, wherein the top sacrificial layer may be a SiGe-layer of greater Ge-content than the lower sacrificial layers.

As an example, the top sacrificial layer may be a layer of $Si_{1-x}Ge_x$, the lower sacrificial layers may be layers of $Si_{1-y}Ge_y$, and the channel layers may be layers of $Si_{1-z}Ge_z$, wherein x>y>z≥0.

In a more specific example, the top sacrificial layer may be a $SiGe_{0.5}$-layer or a $SiGe_{0.65}$-layer, the lower sacrificial layers may be $SiGe_{0.25}$-layers, and the channel layers may be a Si-layer.

In general, the top sacrificial layer 134, the lower sacrificial layers 136a, 136b, and the channel layers 138a, 138b may be formed as nanosheets, i.e. nanosheet-shaped layers, thereby allowing forming of nanosheet-based FETs. A nanosheet may by way of example have a width (i.e. along the Y-direction) in a range from 10 nm to 30 nm and a thickness (i.e. along the Z-direction) in a range from 3 nm to 10 nm, or less. The channel layers 138a, 138b may, as shown herein, be formed with equal or at least similar thickness. The lower sacrificial layers 136a, 136b may also be formed with equal or at least similar thickness. As shown in FIG. 1A, the top sacrificial layer 134, the lower sacrificial layers 136a, 136b, and the channel layers 138a, 138b may have equal or at least similar thickness of each other. However, they may have different thickness to each other.

The top device structure 146 further includes at least one dummy gate 110, in the gate region 142, extending in the direction of the Y-axis across and above the fin structure 140 and the bonding layer 112 as illustrated in the third view. The dummy gate 110 may form a place holder for a final functional gate structure to be formed at a later stage.

To facilitate the gate-to-gate contact between a top gate electrode of the final top FET device and the bottom gate electrode 118 of the bottom FET device 148, the dummy gate 110 may be formed at a location directly above the bottom gate electrode 118, such that the dummy gate 110 overlaps the bottom gate electrode 118 of the bottom FET device 148, as viewed along the bottom-up/vertical direction (e.g. the Z-direction). The dummy gate 110 may be formed in a straightforward manner, e.g. by patterning a layer of a dummy gate material (e.g. amorphous silicon) using a suitable single- or multi-patterning technique.

The top device structure 146 may as shown in FIG. 1A further include a capping layer 108 of a dielectric material different from the material of the dummy gate 110. Further, on top of the capping layer 108, a hard mask material 106 remaining from a preceding dummy gate patterning step may be present. Similarly, the bottom FET device 148 may include a capping layer 116 remaining from the forming of the bottom FET device 148.

Figure 1B:
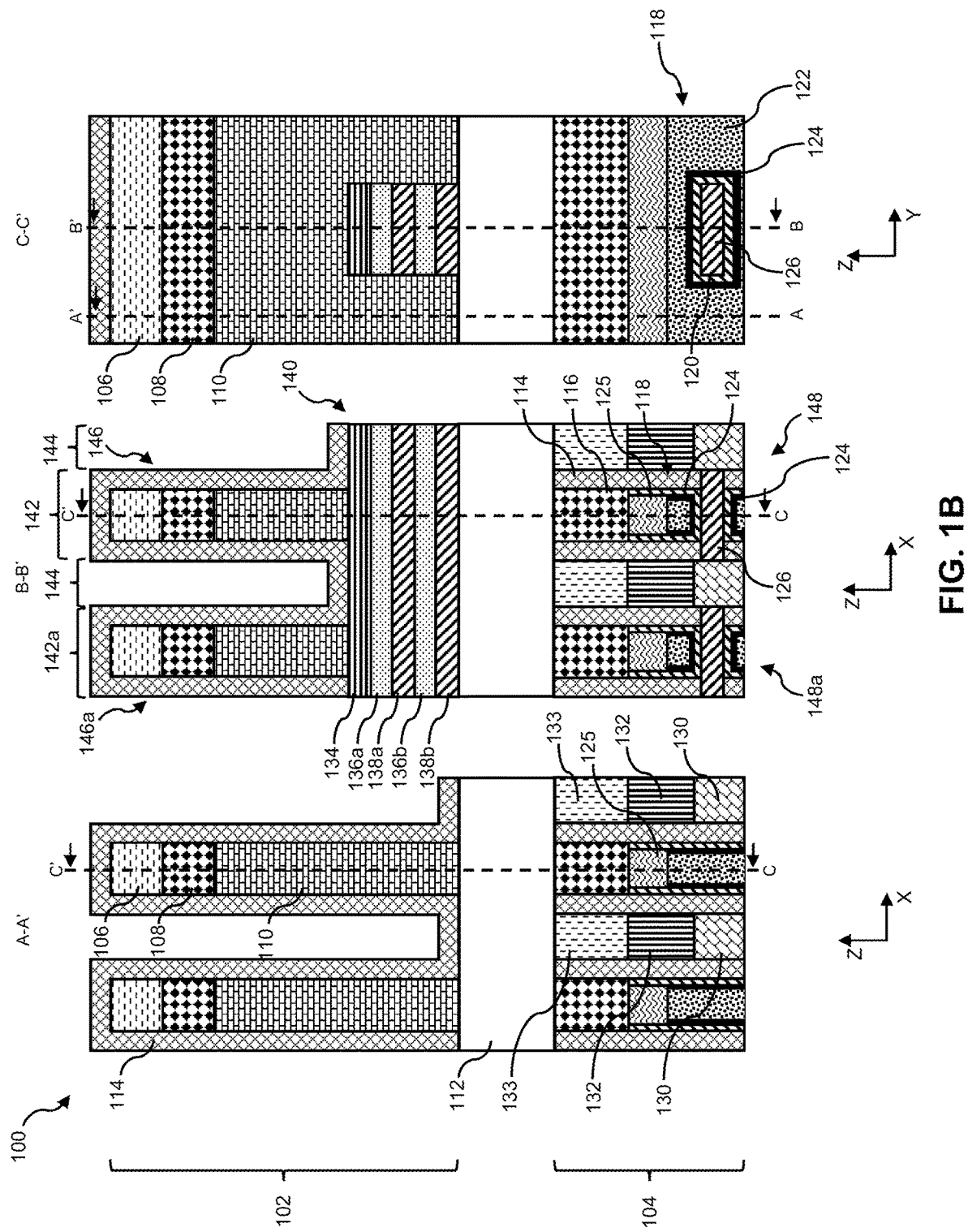
FIG. 1B illustrates a stage of forming a stacked field-effect transistor device in three schematically depicted cross-sectional views, according to example embodiments.

In FIG. 1B a gate spacer 114 has been conformally deposited over the top device structure 146 (e.g. SiC, SiCO, SiCN or SiBCN deposited by ALD).

Figure 1C:
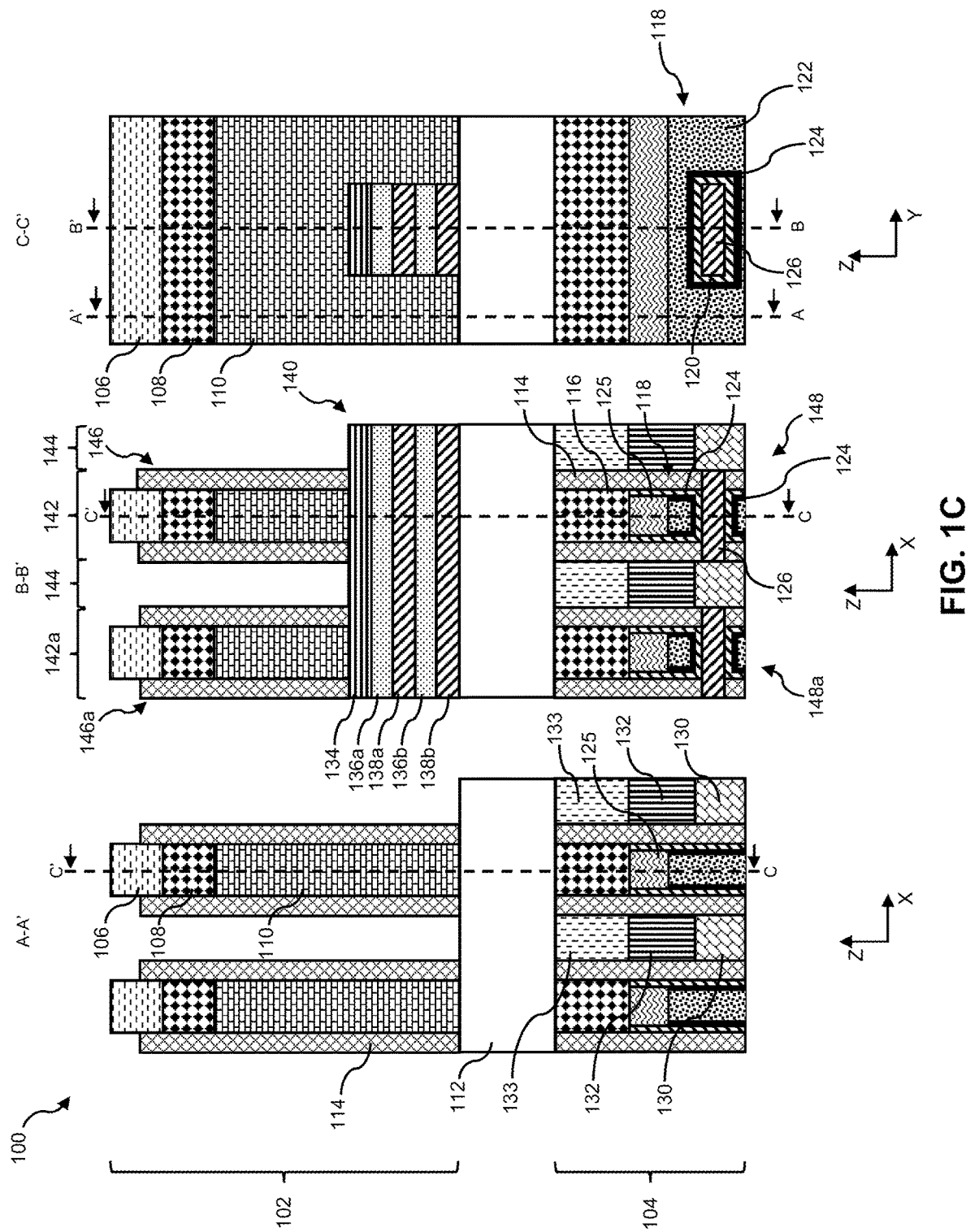
FIG. 1C illustrates a stage of forming a stacked field-effect transistor device in three schematically depicted cross-sectional views, according to example embodiments.

In a subsequent step, shown in FIG. 1C, a (top-down) anisotropic etch has been performed to remove portions of the previously deposited gate spacer 114 from horizontally oriented surfaces of the top device level 102. A result of which is a layer of gate spacer 114 remaining along only the sides of the dummy gate 110.

Figure 1D:
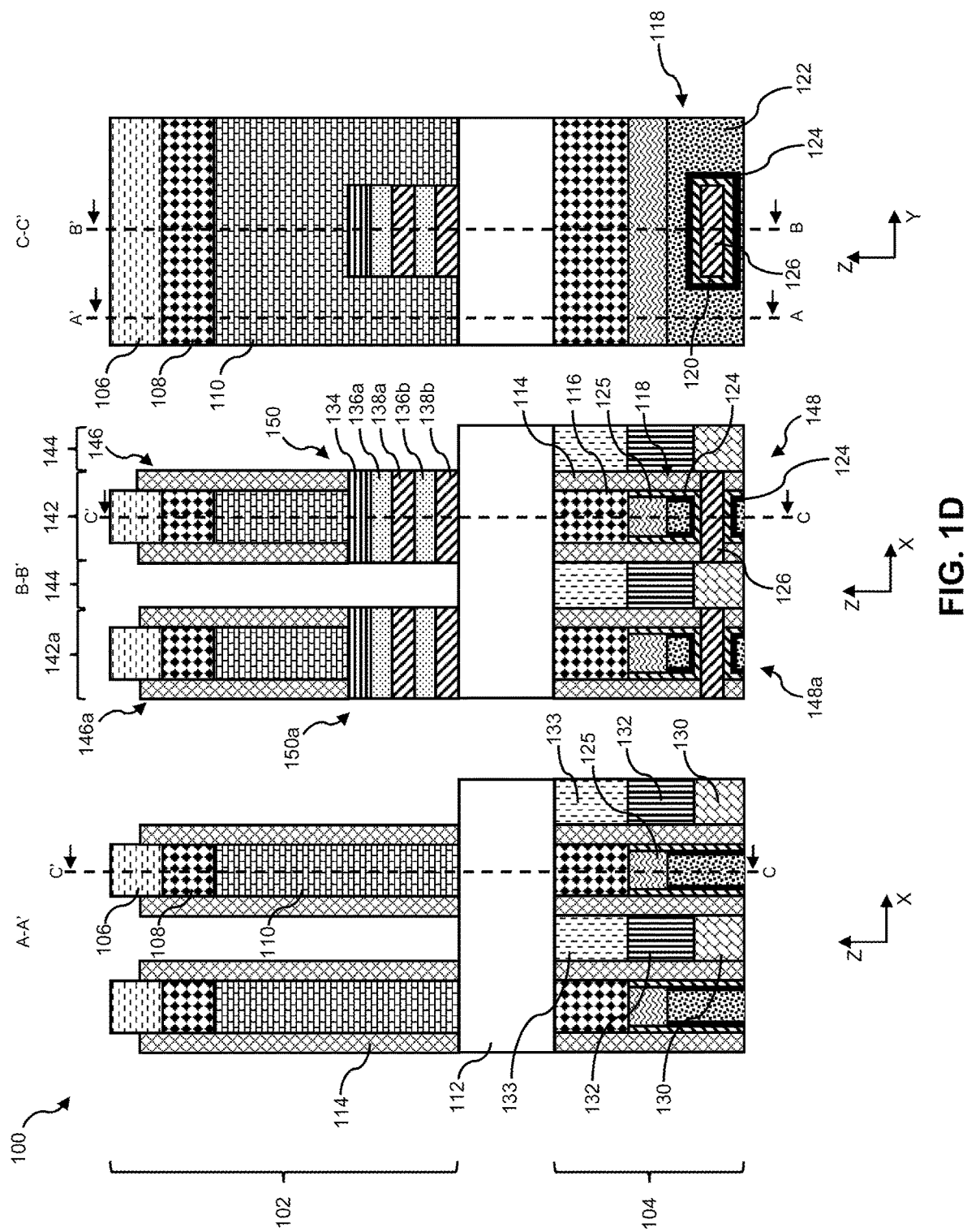
FIG. 1D illustrates a stage of forming a stacked field-effect transistor device in three schematically depicted cross-sectional views, according to example embodiments.

In FIG. 1D, a device layer structure 150 is formed under the dummy gate 110 by recessing the fin structure 140 at either sides of the dummy gate 110. The recessing of the fin structure 140 extends through all layers of the fin structure 140, which in this example are the two channel layers 138a, 138b, the two lower sacrificial layers 136a, 136b, and the top sacrificial layer 134. A space between the device layer structure 150 and a neighboring device layer structure 150a of the additional top device structure 146a is thus formed in the source/drain region 144 therebetween. The device layer structure 150 of the top device structure 146 may at least partly overlap the bottom channel layer 126 of the bottom FET device 148, as viewed along a top-down direction.

Figure 1E:
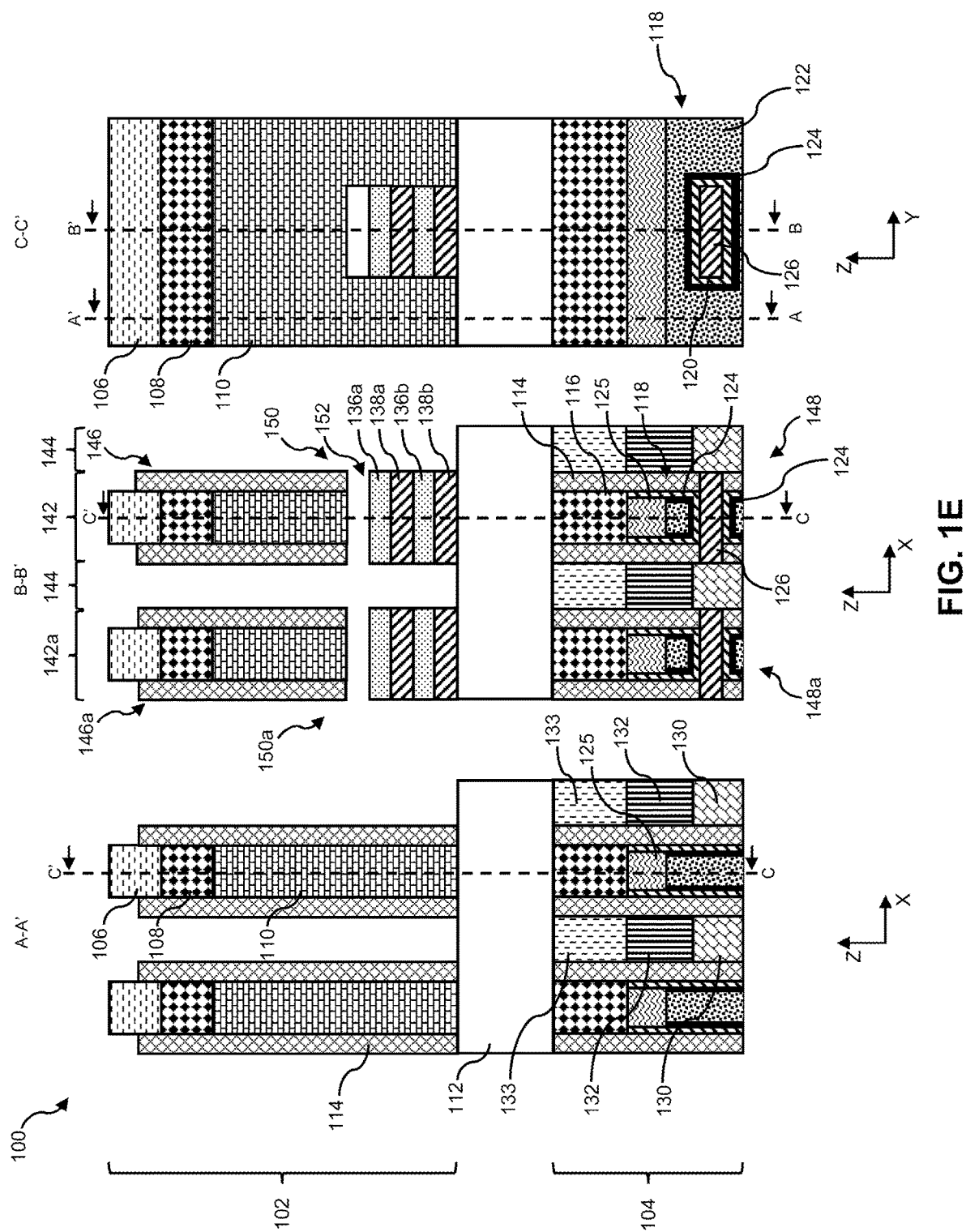
FIG. 1E illustrates a stage of forming a stacked field-effect transistor device in three schematically depicted cross-sectional views, according to example embodiments.
Figure 1F:
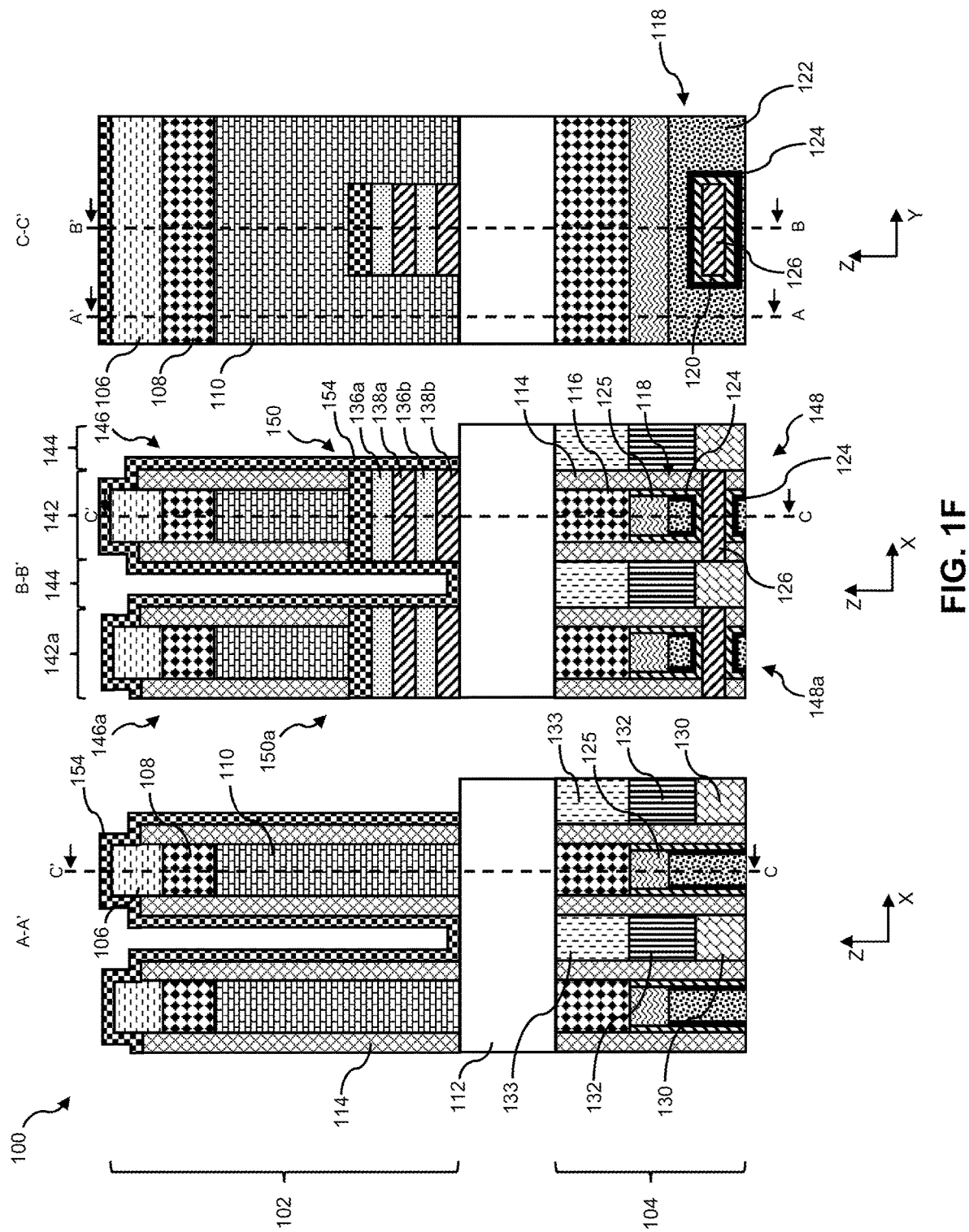
FIG. 1F illustrates a stage of forming a stacked field-effect transistor device in three schematically depicted cross-sectional views, according to example embodiments.
Figure 1G:
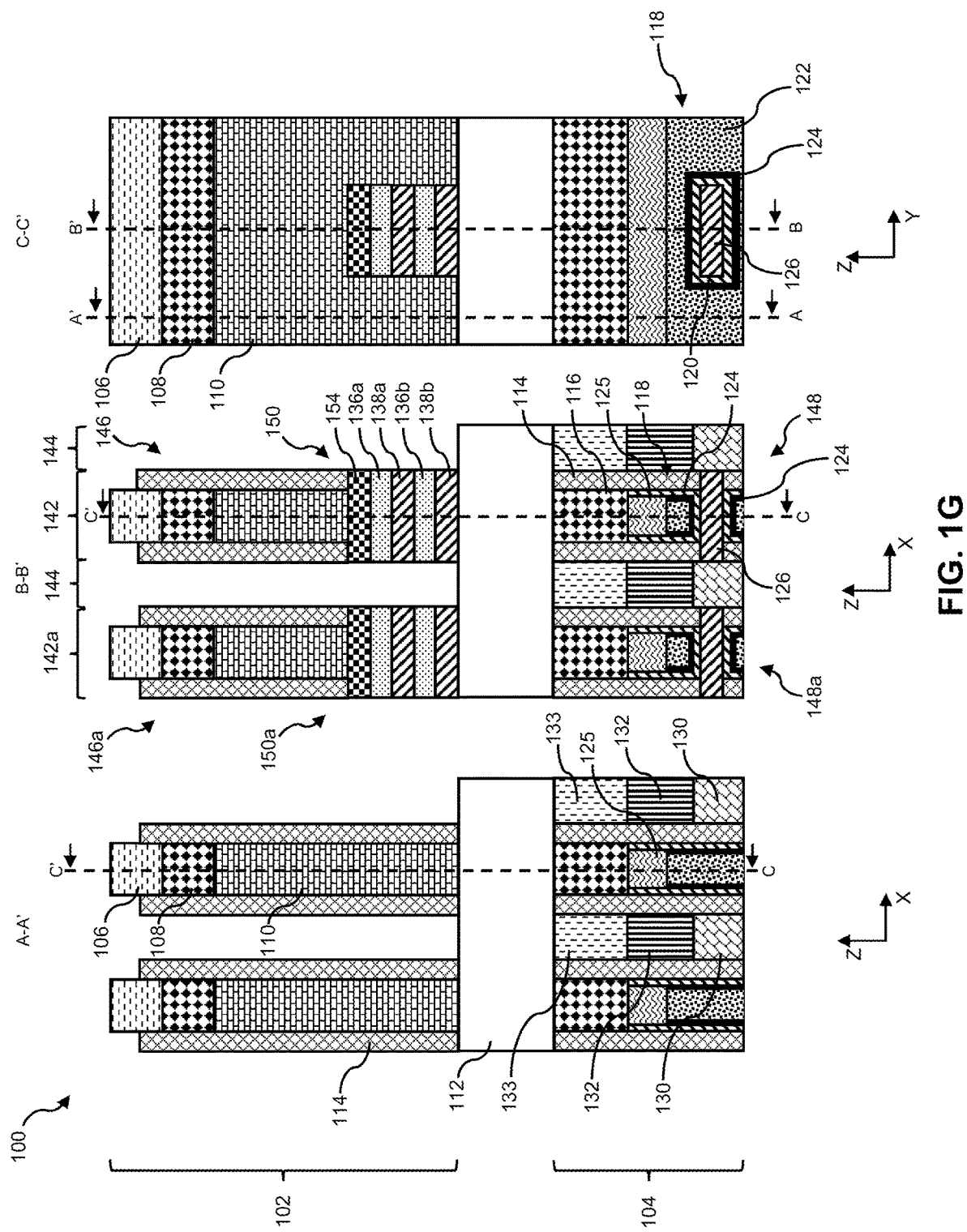
FIG. 1G illustrates a stage of forming a stacked field-effect transistor device in three schematically depicted cross-sectional views, according to example embodiments.

FIGS. 1E-1G illustrates steps of replacing the top sacrificial layer 134, with a dummy layer 154 of a dielectric dummy material, different from the material of the bonding layer 112.

In FIG. 1E, the top sacrificial layer 134 is removed such that a cavity or space 152 is formed under the dummy gate 110, in the illustrated example between the dummy gate 110 and the top-most lower sacrificial layer 136a. The top sacrificial layer 134 may be selectively removed by etching the first sacrificial material of the top sacrificial layer 134 selectively to the channel material of the channel layers 138a, 138b. In the case of one or more lower sacrificial layers 136a, 136b, the etching may also be performed selectively to the lower sacrificial layers 136a, 136b. The etching of the top sacrificial layer 134 may be performed from end surfaces of the device layer structure 150 on either side of the dummy gate 110, which were exposed after the recessing of the fin structure 140. The end surfaces of the top sacrificial layer 134 may accordingly be etched back laterally along the direction of the X-axis until the top sacrificial layer 134 is completely removed from the device layer structure 150. A (wet or dry) isotropic etching process may be used. For example, selective etching of a top sacrificial layer 134 of SiGe with a greater Ge-content than the channel layers 138a, 138b and lower sacrificial layers 136a, 136b may be achieved using an HCl-based dry etch. A further example is selective etching using an ammonia-peroxide mixture (APM). However, other etching processes allowing selective etching of higher Ge-content SiGe-material to lower Ge-content SiGe layers (and Si-layers) may also be employed for this purpose.

In FIG. 1F, the dielectric dummy material is deposited to form a dummy layer 154 filling the space 152 formed by the removal of the top sacrificial layer 134. In this example, the dielectric dummy material is conformally deposited over the top device structure 146, e.g. by ALD, but other deposition processes allowing the space 152 to be filled with the dielectric dummy material may also be used. The dielectric dummy material may be a metal oxide, or a material which is compatible with (i.e. withstand) a subsequent etching process for forming a gate-to-gate-contact via, such that the dummy layer 154 may act as an etch mask during the etching processes. Further examples of dielectric dummy material include e.g. an oxide, a nitride, a carbide, such as SiN, SiC, SiCO, SiCN or SiBCN.

In FIG. 1G, the dielectric dummy material deposited outside the space has been removed. This may be done by isotropically etching the dielectric dummy material. Thus, a discrete dummy layer 154 has been formed as a topmost layer in the device layer structure 150.

Figure 1H:
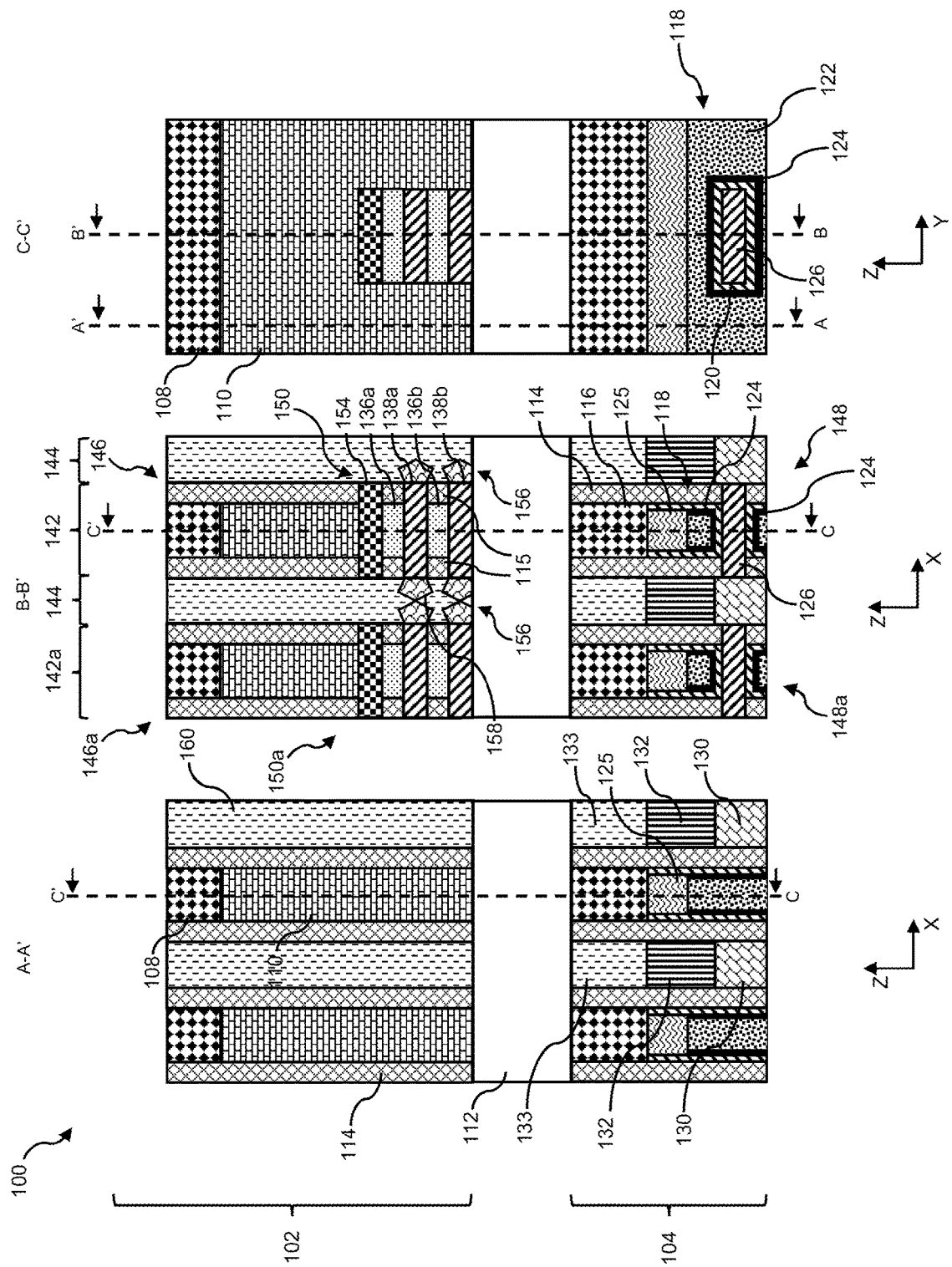
FIG. 1H illustrates a stage of forming a stacked field-effect transistor device in three schematically depicted cross-sectional views, according to example embodiments.

In FIG. 1H, source and drains 156 of the top device structure 146 have been formed on opposite sides of the device layer structure 150 in the source/drain regions 144. Each source and drain 156 may include a source/drain body 158 for each of the channel layers 138a, 138b, of the device layer structure 150, which may be epitaxially grown on exposed ends of the channel layers 138a, 138b in the space formed after the recess of the fin structure 140 as shown in FIG. 1D. As may be appreciated, the specific semiconductor material for the epitaxy may be selected in view of the channel layer material. For instance, Si selective area epitaxy may be performed on Si channel layers.

The source and drains 156 may be doped in accordance with the desired conductivity type of the final top FET device in regard to the bottom FET device 148, for instance through in-situ doping. However, implantation doping, or diffusion doping may also be employed. As an example, the source and drains 156 in the top device structure 146 may be doped with a p-type dopant to form a p-type top FET or an n-type dopant to form an n-type top FET.

The source and drain bodies 158 may subsequently be covered by a dielectric layer 160, for example of an oxide such as $SiO_2$ or another conventional (low-k) inter-layer dielectric material.

Prior to forming the source and drains 156, so-called inner spacers 115 may be formed by recessing the lower sacrificial layers 136a, 136b along the direction of the X-axis and filling the recesses with a dielectric spacer material, e.g. by ALD followed by an isotropic etch step. The recess may be achieved by a selective and lateral etch back of end surfaces of the lower sacrificial layers 136a, 136b from the source/drain regions 144. As indicated in FIG. 1H a same material may be used for the inner spacers 115 as for the gate spacer 114 however it is also possible to use another dielectric material.

Figure 1I:
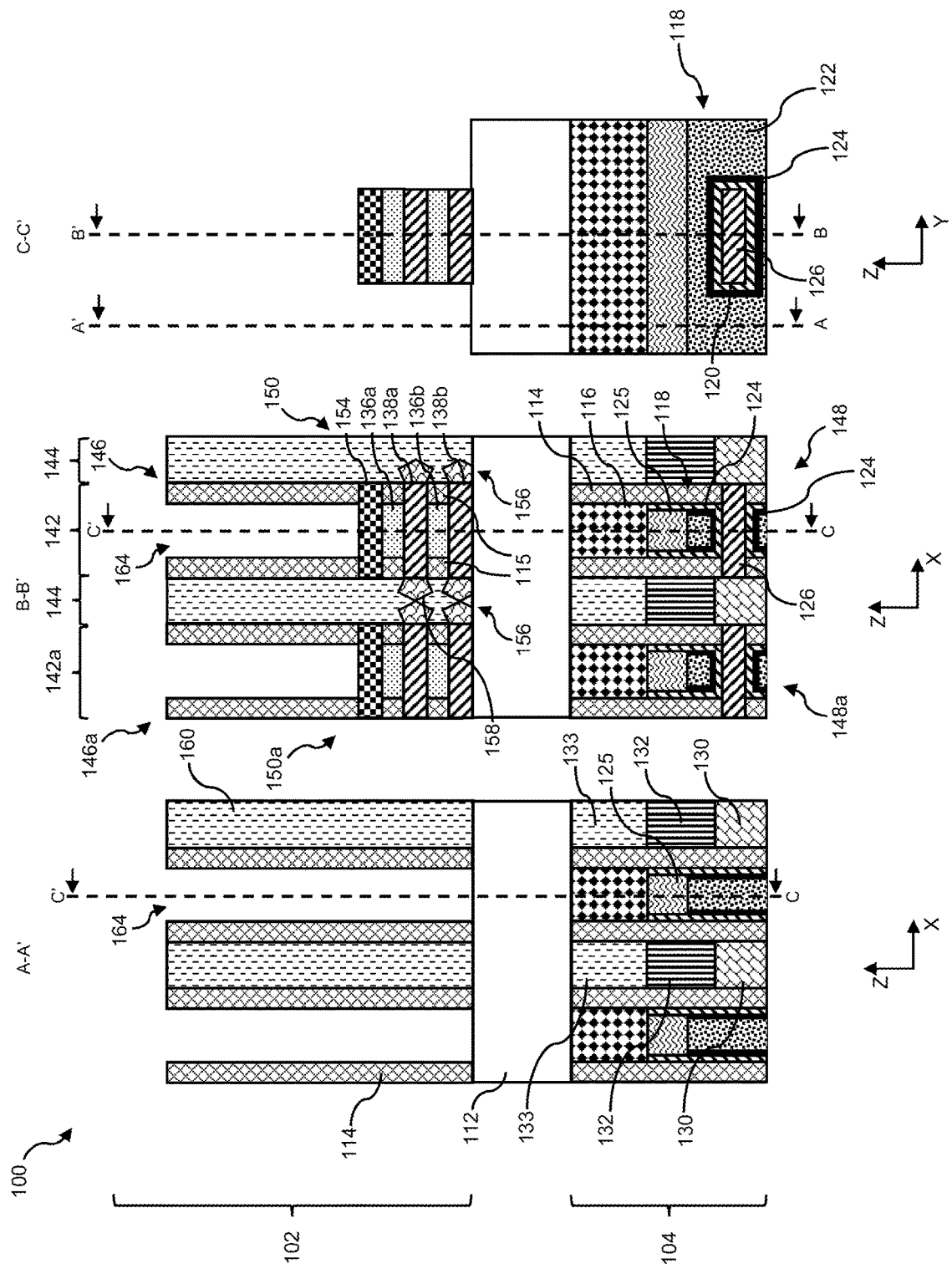
FIG. 1I illustrates a stage of forming a stacked field-effect transistor device in three schematically depicted cross-sectional views, according to example embodiments.

In FIG. 1I, a gate trench 164 has been formed. The gate trench 164 may be formed by removing the dummy gate 110 extending across the device layer structure 150. Removing the dummy gate 110 may be done by selectively etching the dummy gate 110 (i.e. selectively etching the dummy gate material) such that the gate spacer 114 is preserved. By removing the dummy gate 110, the device layer structure 150 is exposed within the gate trench 164, as well as the bonding layer 112 beneath the previous dummy gate 110.

Figure 1J:
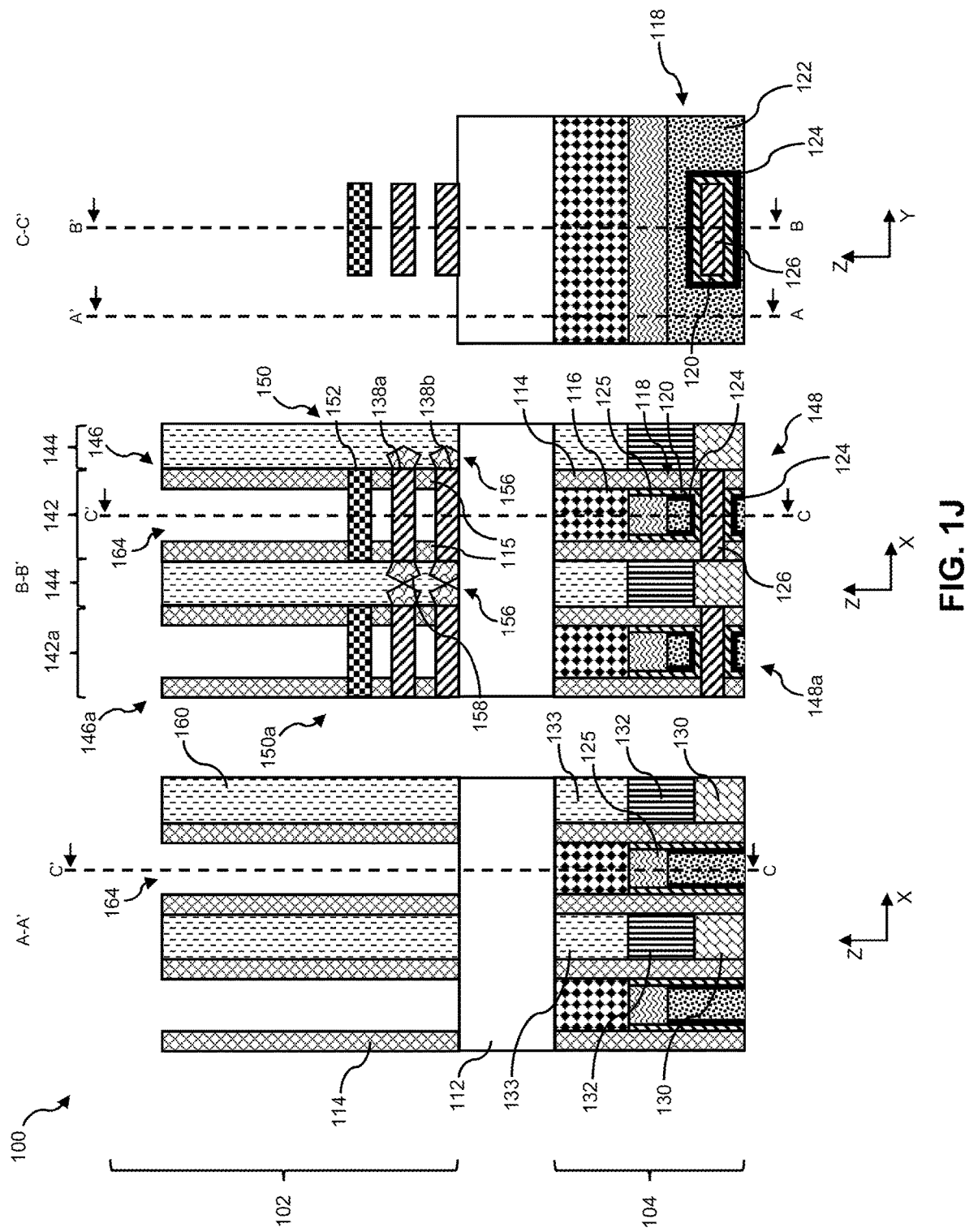
FIG. 1J illustrates a stage of forming a stacked field-effect transistor device in three schematically depicted cross-sectional views, according to example embodiments.

In FIG. 1J, the lower sacrificial layers 136a, 136b have been removed, e.g. by etching the lower sacrificial layers 136a, 136b selectively to the channel layers 138a, 138b and the dummy layer 154. The channel layers 138a, 138b may thereby be "released". In the illustrated example, the topmost channel layer 138a is fully released in the sense that both the top side and bottom side of the channel layer 138a surface is exposed. Meanwhile the lower channel layer 138b is only partially released in that the top side but not the bottom side of the channel layer 138b is exposed. Had a further lower sacrificial layer been present underneath the channel layer 138b, also the lower channel layer 138b would be fully released.

Figure 1K:
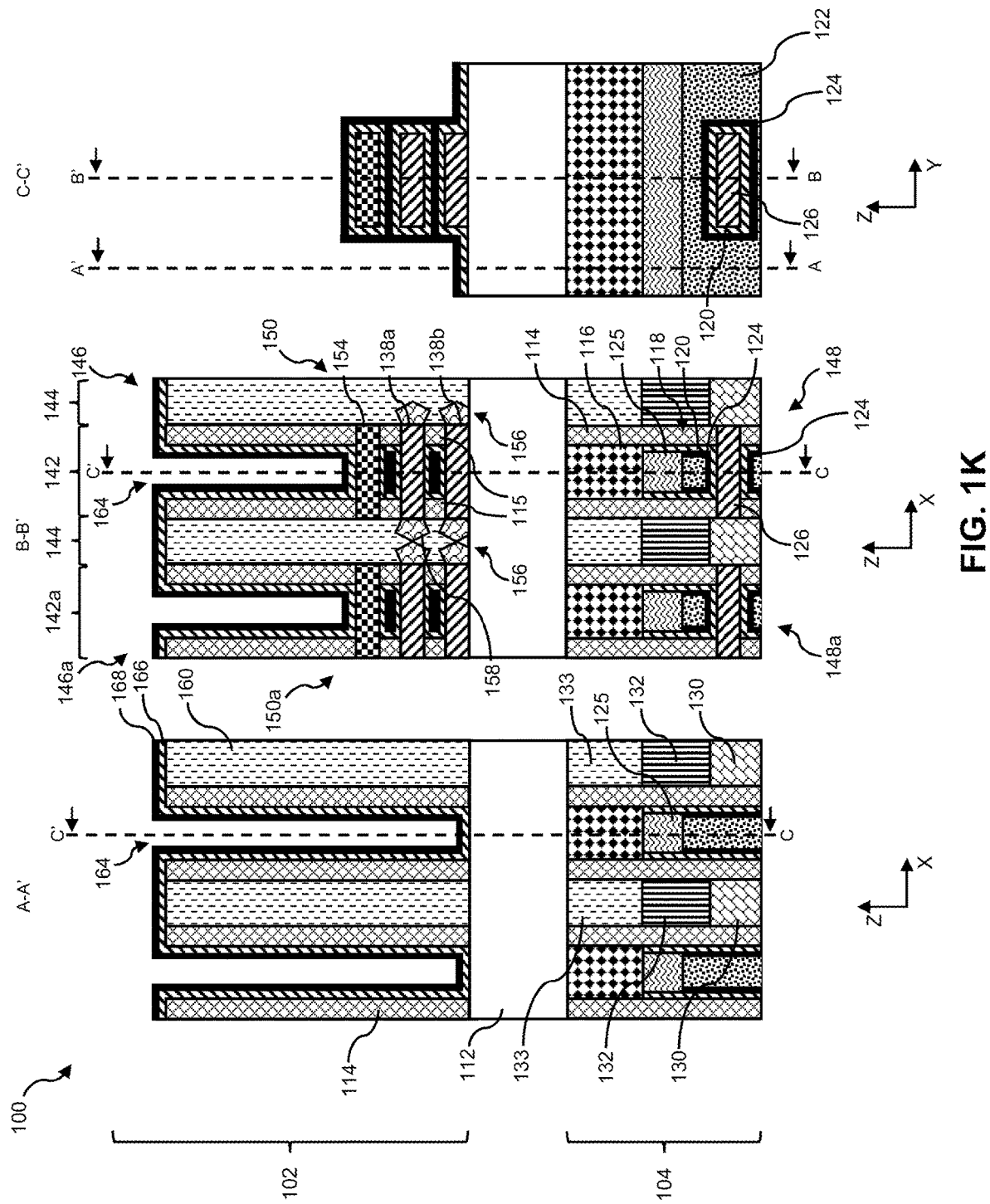
FIG. 1K illustrates a stage of forming a stacked field-effect transistor device in three schematically depicted cross-sectional views, according to example embodiments.

In FIG. 1K, a gate dielectric 166 has been conformally deposited over the top device structure 146, e.g. using ALD. Due to the removal of the lower sacrificial layers 136a, 136b, the gate dielectric 166 may also be deposited on exposed surfaces of the channel layers 138a, 138b and the dielectric dummy layer 154, e.g. respective top, bottom, and side surfaces. Example gate dielectrics include conventional gate dielectrics of a high-k, such as $HfO_2$, LaO, AlO, and ZrO.

Subsequently to depositing the gate dielectric 166, a work function metal 168 may be conformally deposited on the gate dielectric 166 as illustrated herein, e.g. using ALD. Example of work function metals (WFM) include conventional n-type and p-type effect WFM metals, such as TiN, TaN, TiAl, TiAlC, or WCN, or combinations thereof. In correspondence with the discussion of the bottom gate electrode 118, it is possible to deposit one or more additional work function metals on the work function metal 168. Hence, for the purpose of the following description, reference sign 168 may be understood to denote one conformally deposited work function metal or a stack of two or more conformally deposited work function metals.

Figure 1L:
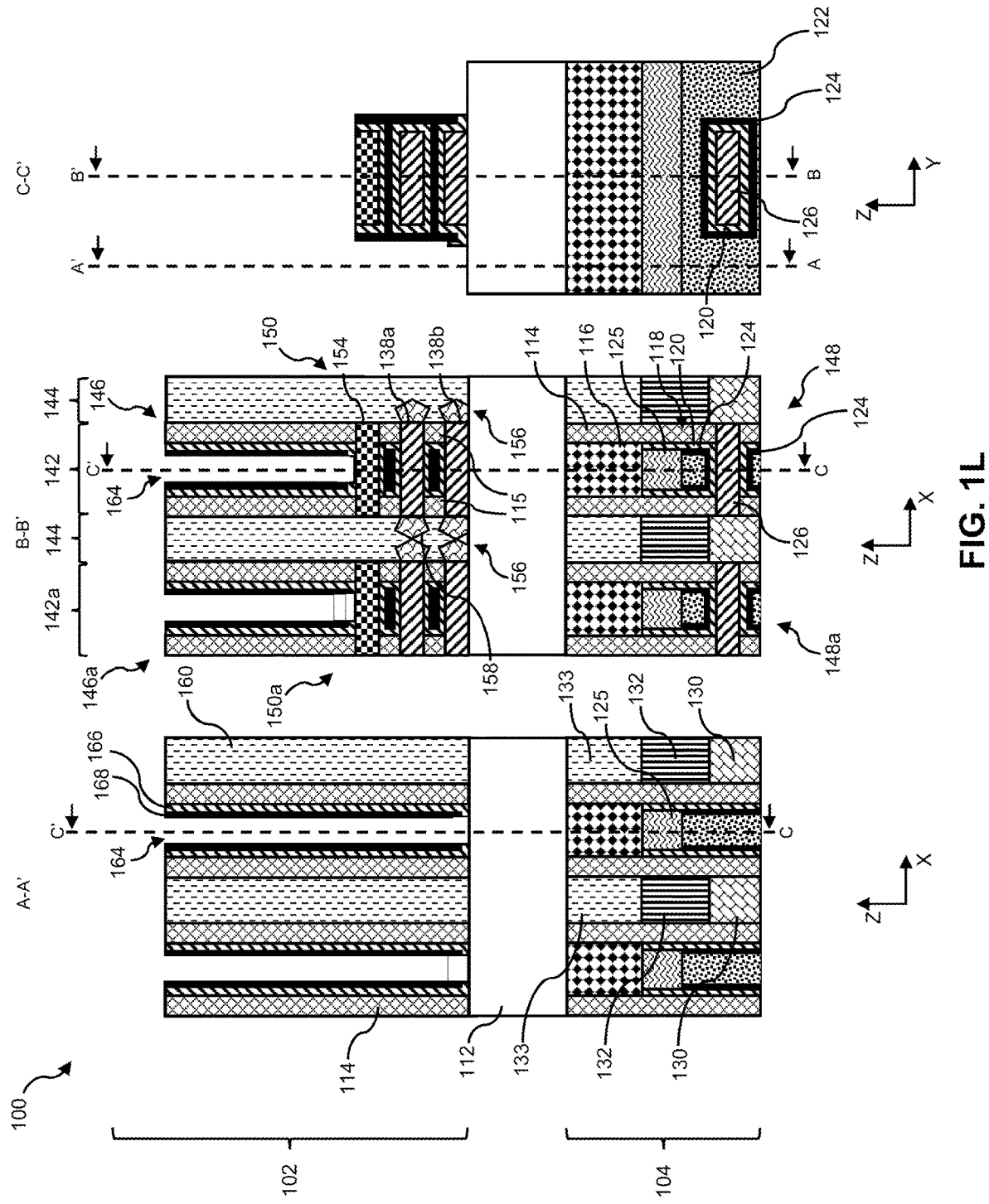
FIG. 1L illustrates a stage of forming a stacked field-effect transistor device in three schematically depicted cross-sectional views, according to example embodiments.

In FIG. 1L a top-down anisotropic etch of the work function metal 168 (if present) and the gate dielectric 166 has been performed in order to expose upper surface portions the bonding layer 112 at the bottom of the gate trench 164, at either side of the device layer structure 150. As shown in FIG. 1L, the etching may further remove portions of the work function metal 168 and the gate dielectric 166 deposited on top of the dummy layer 154, such that an upper surface of the dummy layer 154 is exposed. To provide an increased masking budget for subsequent etch steps, the work function metal 168 and the gate dielectric 166 may each be etched selectively to the dielectric dummy material of the dummy layer 154, such that the dummy layer 154 is at least partially preserved.

Figure 1M:
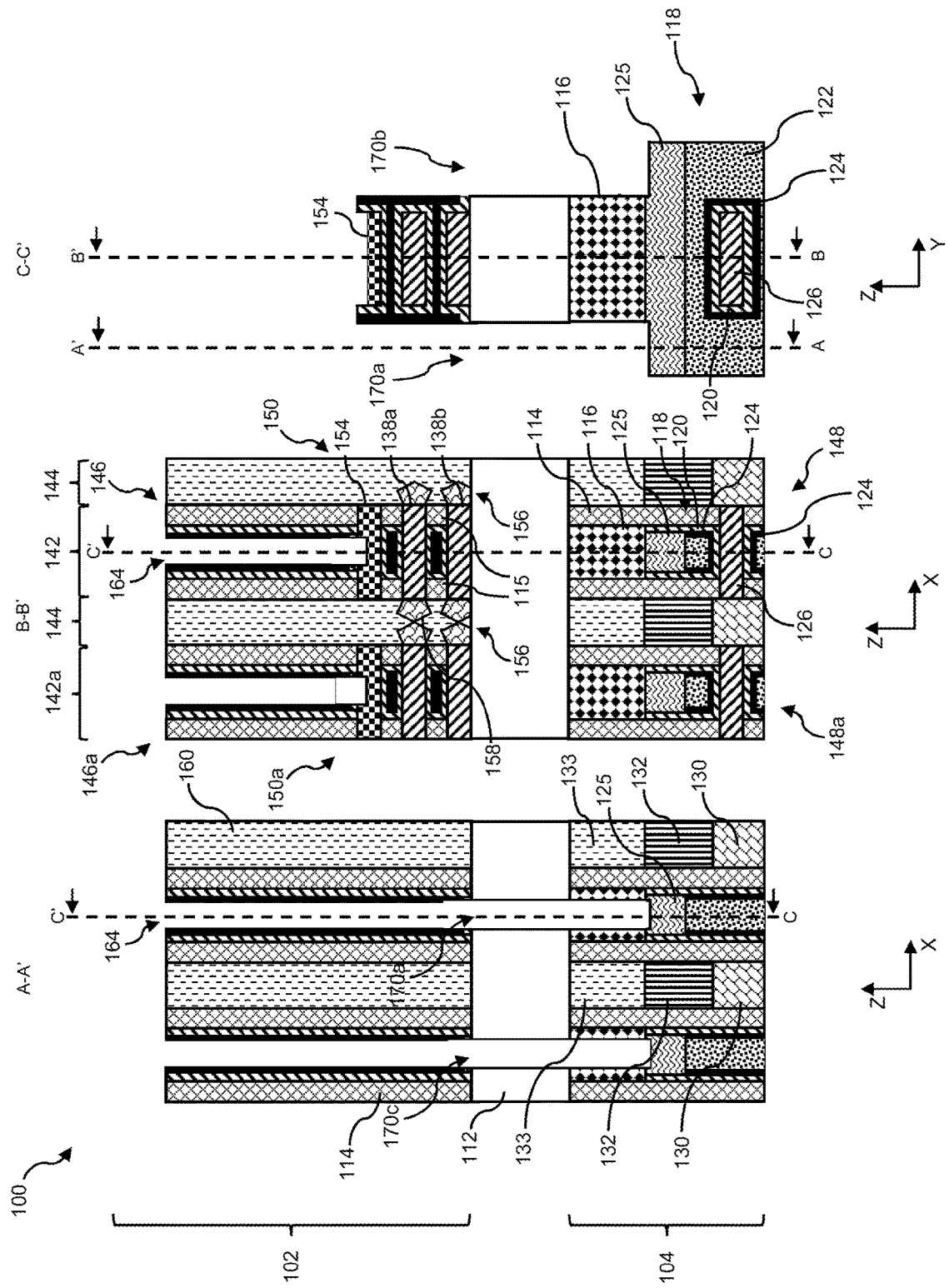
FIG. 1M illustrates a stage of forming a stacked field-effect transistor device in three schematically depicted cross-sectional views, according to example embodiments.

In FIG. 1M a pair of gate-to-gate contact trenches 170a, 170b has been formed. The gate-to-gate contact trenches 170a, 170b may be formed beside the device layer structure 150. The process of forming the gate-to-gate contact trenches 170a, 170b may include etching upper surface portions of the bonding layer 112 exposed in the bottom of the gate trench 164 to form a preliminary pair of trenches in the bonding layer 112, and subsequently etching the capping layer 116 via the preliminary trenches to form the final gate-to-gate contact trenches 170a, 170b exposing a top surface of the bottom gate electrode 118 (e.g. formed by the gate fill metal 125). When etching the gate-to-gate contact trenches 170a, 170b in the gate trench 164, the dummy layer 154 (which may be exposed during the etching of the work function metal 168 and the gate dielectric 166) may act as an etch mask for the channel layers 138a, 138b provided below the dummy layer 154 and portions of the gate dielectric 166 deposited on the channel layers 138a, 138b. The dummy layer 154 may be partially consumed during the etching process to obtain a reduced in thickness, as seen in the third view. Accordingly, an original thickness of the dummy layer 154 may be chosen such that the dummy layer 154 is not entirely removed during the etching of the bonding layer 112 and/or the capping layer 116. The pair of gate-to-gate contact trenches 170a, 170b may be formed in the gate trench 164 on both sides of the device layer structure 150, as seen in the third view.

According to the illustrated approach, gate-to-gate contact trenches 170a, 170b may be formed on both sides of the device layer structure 150 without requiring a further dedicated contact trench-etch mask. This approach may hence be referred to as an "un-masked approach". Alternatively, only a single gate-to-gate contact trench may be formed using a "masked approach", employing a dedicated contact trench-etch mask when etching the gate-to-gate contact trench. The single gate-to-gate contact trench may then be formed at a selected side of the device layer stack 150. The dummy layer 154 may be used in conjunction with the dedicated contact trench-etch mask such that the gate-to-gate contact trench may be formed self-aligned to a side of the device layer stack 150. It is to be noted that in the masked approach as well as in the un-masked approach, a mask layer may be formed to cover the dielectric layer 160, to counteract etching of the dielectric layer 160 while etching the bonding layer 112 and the capping layer 116. The mask layer may be formed on the dielectric layer 160 prior to removing the dummy gate 110.

In FIG. 1N, a gate electrode material has been deposited in the gate trench 164 and the gate-to-gate contact trenches 170a, 170b, to form a top gate electrode 174 along the channel layers 138a, 138b and a gate-to-gate contact 176a, 176b in the respective gate-to-gate contact trenches 170a, 170b. Put differently, the gate electrode material may be deposited in the gate trench 164 and the gate-to-gate contact trenches 170a, 170b to form a single continuous electrical contact between the bottom gate electrode 118 of the bottom FET device 148 and the top gate electrode 174 of the finalized top FET device. The gate electrode material may e.g. be formed of any of the gate fill materials discussed in connection with the bottom gate electrode 118. The gate electrode material(s) may together with the remaining portions of the work function metal 168 define the top gate electrode 174.

After forming the top gate electrode 174, source/drain contacts 162 may be formed on the source and drain bodies 158 of the source and drain region 144. Contact trenches may be formed in the dielectric layer 160 to expose the source and drain bodies 158. Source/drain contact material may thereafter be deposited on the source and drain bodies 158 and be subsequently recessed (e.g. using an etch-back process) to define source/drain electrodes 162 with a desired height. The dielectric layer 160 may thereafter be restored over the contacts 162.

In the above, a limited number of examples have been described. However, as is readily appreciated by a person skilled in the art, other examples than the ones disclosed above are equally possible within the scope of the present disclosure.

For example, in the illustrated embodiment of the method, the gate dielectric 166 (and the work function metal 168) is deposited prior to forming the gate-to-gate contact trenches 170a, 170b. According to a variation of the illustrated embodiment, the gate dielectric 166 (and the work function metal 168) may instead be deposited after forming the gate-to-gate contact trench(es) 170a, 170b. The method may accordingly include conducting the top-down anisotropic etching of the gate dielectric 166 (and the work function metal 168) to remove the gate dielectric 166 (and the work function metal 168) from the bottom of the gate-to-gate contact trench(es) 170a, 170b prior to depositing the gate electrode material.

According to another variation of the illustrated embodiment, the gate dielectric 166 (and the work function metal 168) may instead be deposited after etching the bonding layer 112 (e.g. to form the preliminary gate-to-gate contact trenches) but prior to etching the capping layer 116. The method may accordingly include conducting the top-down anisotropic etching of the gate dielectric 166 (and the work function metal 168) to remove the gate dielectric 166 (and the work function metal 168) from the bottom of the preliminary gate-to-gate contact trench(es) prior to etching the capping layer 116.

According to yet another variation the gate-to-gate contact trench(es) 170a, 170b, or at least the preliminary gate-to-gate contact trench(es), may be formed prior to releasing the channel layers 138a, 138b (e.g. FIG. 1J). According to this variation, the gate dielectric 166 (and the work function metal 168) may be deposited after releasing the channel layers 138a, 138b, e.g. prior to etching the capping layer 116.

According to a further example, while the illustrated embodiments indicate the channel layers of the bottom and top FET device as nanosheet-shaped layers, the method has a more general applicability and may be used also for FETs including channel layers of other shapes. For example, the bottom and/or top FET device may each include at least one channel layer in the shape of a horizontal/lateral nanowire, wherein the bottom and/or top FET device may form a horizontal nanowire FET. According to a further example, the bottom and/or top FET device may each include a single channel layer in the shape of a fin, wherein the bottom and/or top FET device may form a finFET.

Additionally, variations to the disclosed variants can be understood and effected by the skilled person from a study of the drawings, the disclosure, and the appended claims.

What is claimed is:

1. A method for forming a stacked field-effect transistor (FET) device, the method comprising:
   forming a bottom FET device comprising a source, a drain, at least one channel layer between the source and drain, and a bottom gate electrode arranged along the at least one channel layer;
   forming a bonding layer over the bottom FET; and
   forming a top FET device on the bonding layer, wherein forming the top FET device comprises:
      forming a device layer structure comprising:
         at least one channel layer of a channel semiconductor material; and
         over the at least one channel layer, a top sacrificial layer of a sacrificial semiconductor material;
      replacing the top sacrificial layer with a dummy layer of a dielectric dummy material;
      subsequent to replacing the top sacrificial layer, forming a gate-to-gate contact trench beside the device layer structure, the gate-to-gate contact trench exposing a top surface of the bottom gate electrode, wherein forming the gate-to-gate contact trench comprises etching the bonding layer;
      depositing gate electrode material to form a top gate electrode along the at least one channel layer and a gate-to-gate contact in the gate-to-gate contact trench; and
      forming a source and a drain of the top FET device, and
   wherein forming the top FET device further comprises:
      subsequent to replacing the top sacrificial layer and prior to etching the bonding layer, conformally depositing a gate dielectric, wherein forming the top FET device further comprises etching back the gate dielectric in a top-down direction and then etching the bonding layer; or
      subsequent to replacing the top sacrificial layer and etching the bonding layer, conformally depositing a gate dielectric, wherein forming the top FET device further comprises etching back the gate dielectric in a top-down direction prior to depositing the gate electrode material.

2. The method according to claim 1, wherein replacing the top sacrificial layer with the dummy layer comprises:
   removing the top sacrificial layer selectively to the at least one channel layer, and
   depositing the dielectric dummy material in a space formed by the removing of the top sacrificial layer.

3. The method according to claim 2,
   wherein the dielectric dummy material is conformally deposited to fill the space formed by removing the top sacrificial layer, and wherein the method further comprises removing dielectric dummy material deposited outside the space formed by removing the top sacrificial layer by isotropically etching the dielectric dummy material.

4. The method according to claim 1,
wherein forming the top FET device further comprises, subsequent to replacing the top sacrificial layer, exposing the device layer structure in a gate trench by removing a dummy gate extending across the device layer structure,
wherein the gate dielectric subsequently is conformally deposited in the gate trench, and
wherein the etching of the bonding layer and the gate dielectric are conducted in the gate trench.

5. The method according to claim 4, wherein forming the gate-to-gate contact trench comprises etching, in the gate trench, the bonding layer on each side of the device layer structure.

6. The method according to claim 1,
wherein forming the device layer structure comprises:
    forming a fin structure on the bonding layer by patterning an initial device layer structure comprising the at least one channel layer and the top sacrificial layer;
    forming a dummy gate extending across the fin structure; and
    recessing the fin structure at either side of the dummy gate to form the device layer structure,
wherein replacing the top sacrificial layer comprises removing the top sacrificial layer selectively to the at least one channel layer by etching the top sacrificial layer from opposite end surfaces of the device layer stack, and
wherein the opposite end surfaces are defined by the recessing of the fin structure.

7. The method according to claim 1, wherein the dummy material is formed of a dielectric material different from a material of the bonding layer.

8. The method according to claim 1,
wherein the bottom FET device comprises a capping layer on top of the bottom gate electrode,
wherein the capping layer is formed of a dielectric material different from the dummy material, and
wherein forming the gate-to-gate contact trench further comprises etching the capping layer.

9. The method according to claim 1, wherein forming the top FET device further comprises:
    subsequent to depositing the gate dielectric, conformally depositing a work function metal on the gate dielectric; and
    etching the work function metal and then the gate dielectric.

10. The method according to claim 1,
wherein the device layer structure comprises a lower sacrificial layer arranged on the at least one channel layer,
wherein the top sacrificial layer is arranged on the lower sacrificial layer,
wherein the top sacrificial layer is formed of a first sacrificial semiconductor material and the lower sacrificial layer is formed of a second sacrificial semiconductor material different from the first sacrificial semiconductor material and the channel semiconductor material, and
wherein forming the top FET device further comprises, subsequent to replacing the top sacrificial layer and prior to depositing the gate dielectric, removing the lower sacrificial layer selectively to the at least one channel layer.

11. The method according to claim 10,
wherein the device layer structure comprises a further lower sacrificial layer of the second sacrificial semiconductor material, and
wherein the channel layer is arranged on the further lower sacrificial layer.

12. The method according to claim 1, wherein the FET device is a complementary FET device.

* * * * *